United States Patent
Preikszas et al.

(10) Patent No.: US 7,022,987 B2
(45) Date of Patent: Apr. 4, 2006

(54) PARTICLE-OPTICAL ARRANGEMENTS AND PARTICLE-OPTICAL SYSTEMS

(75) Inventors: Dirk Preikszas, Oberkochen (DE); Michael Steigerwald, Aalen (DE)

(73) Assignee: Carl Zeiss NIS GmbH (DE)

( * ) Notice: Subject to any disclaimer, the term of this patent is extended or adjusted under 35 U.S.C. 154(b) by 0 days.

(21) Appl. No.: 10/634,810

(22) Filed: Aug. 6, 2003

(65) Prior Publication Data

US 2004/0075053 A1 Apr. 22, 2004

Related U.S. Application Data

(63) Continuation-in-part of application No. PCT/EP02/01553, filed on Feb. 14, 2002.

(30) Foreign Application Priority Data

| Feb. 20, 2001 | (DE) | .......................................... 101 07 910 |
| Aug. 6, 2002 | (DE) | .......................................... 102 35 981 |

(51) Int. Cl.
*H01J 37/26* (2006.01)
*H01J 37/147* (2006.01)

(52) U.S. Cl. ................................ 250/310; 250/396 ML
(58) Field of Classification Search ................. 250/310, 250/396 ML
See application file for complete search history.

(56) References Cited

U.S. PATENT DOCUMENTS

| 2,161,466 A | 6/1939 | Henneberg |
| 3,660,658 A | 5/1972 | Leboutet et al. |
| 4,107,526 A | 8/1978 | McKinney et al. |
| 4,367,406 A | 1/1983 | Franzen et al. |

(Continued)

FOREIGN PATENT DOCUMENTS

| DE | 39 31 970 A1 | 4/1991 |
| DE | 40 41 495 A1 | 6/1992 |
| DE | 101 07 910 A1 | 8/2002 |
| EP | 0 530 640 A1 | 3/1993 |
| EP | 0 999 573 A1 | 5/2000 |

OTHER PUBLICATIONS

Preikszas et al. "Correction properties of electron mirrors,"Journal of Electron Microscopy, vol. 1, pp. 1–9 (1997), Japanese Society of Electron Microscopy, Japan.*

By Muller et al. "A beam separator with small aberrations,"Journal of Electron Microscopy, vol. 48, No. 3, pp.–191–204 (1991), Japanese Society of Electron Microscopy, Japan).*

Fink et al., "Smart; a planned ultrahigh–resolution spectromicroscope for Bessy II," Journal of Electron Spectroscopy and Related Phenomena, vol. 84, pp. 231–250 (1997), Elsevier Science B.V.*

Rose, H. et al, "Time dependent perturbation formalism for calculating the aberrations of systems with large ray gradients," Nuclear Instruments and Methods in Physics Research A 363, 1995, pp. 301–315, Elsevier science B.V..

U.S. Appl. No. 10/644,037.

H. Müller et al., "*A beam separator with small aberrations,*" Journal of Electron Microscopy, vol. 48, No. 3, pp. 191–204 (1991), Japanese Society of Electron Microscopy, Japan.

(Continued)

*Primary Examiner*—Nikita Wells
*Assistant Examiner*—James J. Leybourne
(74) *Attorney, Agent, or Firm*—Jones Day

(57) ABSTRACT

There are disclosed particle-optical beam splitters providing at least three beam-manipulating regions having magnetic fields of different field strengths provided therein for at least one particle beam passing the beam splitter. The beam splitter is, in first order, free of dispersion, astigmatism and distortion.

43 Claims, 10 Drawing Sheets

U.S. PATENT DOCUMENTS

| | | |
|---|---|---|
| 4,740,704 A | 4/1988 | Rose et al. |
| 4,866,272 A | 9/1989 | Aoki |
| 5,177,361 A | 1/1993 | Krahl et al. |
| 5,319,207 A | 6/1994 | Rose et al. |
| 5,336,885 A | 8/1994 | Rose et al. |
| 5,449,914 A | 9/1995 | Rose et al. |
| 5,644,132 A | 7/1997 | Litman et al. |
| 5,986,269 A | 11/1999 | Krijn et al. |
| 6,097,028 A | 8/2000 | Tsuno |
| 6,150,657 A | 11/2000 | Kimoto et al. |
| 6,239,430 B1 | 5/2001 | Weimer et al. |
| 6,307,205 B1 | 10/2001 | Tsuno |
| 6,310,341 B1 | 10/2001 | Todokoro et al. |
| 6,384,412 B1 | 5/2002 | Krahl et al. |
| 6,522,056 B1 | 2/2003 | Mauck |
| 6,611,087 B1 | 8/2003 | Mauck |
| 2004/0036031 A1 | 2/2004 | Rose et al. |

OTHER PUBLICATIONS

D. Preikszas et al., "*Corrected Low–Energy Electron Microscope for Multi–Mode Operation,*" Proceedings of the 13th International Congress on Electron Microscopy, ICEM 13—Paris, pp. 197–198 (Jul. 17–22, 1994).

D. Preikszas et al., "*Correction properties of electron mirrors,*" Journal of Electron Microscopy, vol. 1, pp. 1–9 (1997), Japanese Society of Electron Microscopy, Japan.

H. Rose et al., "*Outline of a versatile corrected LEEM,*" OPTIK, vol. 92, No. 1, pp. 31–44, (1992), Wissenschaftliche Verlagsgesellschaft mbH, Stuttgart, Germany.

R. Fink et al., "*Smart: a planned ultrahigh–resolution spectromicroscope for Bessy II,*" Journal of Electron Spectroscopy and Related Phenomena, vol. 84, pp. 231–250 (1997), Elsevier Science B.V.

V. Kolarik et al., "*Close packed prism arrays for electron microscopy,*"OPTIK, vol. 87, No. 1, pp. 1–12 (1991), Wissenschaftliche Verlagsgesellschaft mbH, Stuttgart, Germany.

\* cited by examiner

PARTICLE-OPTICAL ARRANGEMENTS AND PARTICLE-OPTICAL SYSTEMS

This application is a continuation-in-part of International Application No. PCT/EP02/01553 filed on Feb. 14, 2002, which International Application was not published by the International Bureau in English on Aug. 29, 2002, the entire contents of which are incorporated herein by reference. This application is also based upon DE 101 07 910.9 filed on Feb. 20, 2001 and DE 102 35 981.4 filed on Aug. 6, 2002, the entire contents of each of which are incorporated herein by reference.

BACKGROUND OF THE INVENTION

1. Field of the Invention

The present invention relates to a particle-optical arrangement and to particle-optical systems, such as an electron microscopy system and an electron lithography system, comprising such particle-optical arrangement.

2. Brief Description of Related Art

In an electron microscope for inspecting an object a primary electron beam is directed to the object and secondary electrons emanating from the object are directed as a secondary electron beam to a detector.

Within the scope of the present application, the term "secondary electrons" comprises, among others:
- "mirror electrons", i.e., primary electrons which are reflected from the object and which do not fully reach the surface of the object,
- "backscattering electrons", i.e., electrons emitted from the object whose energy is substantially equal to that of the primary electrons directed to the object (elastically scattered electrons); and
- "secondary electrons in the narrower sense", i.e., those electrons emitted from the object whose kinetic energy is substantially lower than that of the primary electrons (inelastically scattered electrons).

In electron microscopes, there is a need to separate the beam path of the primary electron beam from a beam path of the secondary electron beam in order to be able to manipulate these beams independently of each other. Thus, in an electron microscope operating with 180° reflection, i.e. an electron microscope having coinciding primary and secondary electron beams close to the object, both beams have to pass through deflecting fields of a beam splitter. Deflections of the beams provided by the beam splitter may cause a distortion, an energy dispersion and an astigmatism in the primary and secondary electron beams.

From U.S. Pat. No. 5,319,207 there is known a particle-optical system having a beam splitter providing low distortion, energy dispersion and astigmatism for a beam of charged particles passing therethrough. For obtaining such advantageous optical properties for one beam passing the beam splitter it is not sufficient to provide only one single magnetic field region in the beam path of this beam. At least three subsequent beam-manipulating magnetic field regions will have to be passed by the beam for providing the necessary compensations to obtain the advantageous optical properties.

Nonetheless, the magnetic beam splitter known from U.S. Pat. No. 5,319,207 has some disadvantages in view of obtaining a desired accuracy in adjusting the beam path through the beam splitter such that the advantageous optical properties are obtained.

SUMMARY OF THE INVENTION

It is therefore an object of the present invention to provide a particle-optical arrangement providing a function of a beam splitter having advantageous optical properties, in particular with regard to a low distortion and/or a low energy dispersion and/or a low astigmatism.

Moreover, it is an object of the present invention to provide a particle-optical system, such as an electron microscopy system and an electron lithography system, wherein beam paths of electron beams therethrough are separated from each other.

According to a first aspect, the invention provides a particle-optical arrangement comprising a beam splitter and a beam-guiding system for guiding first and second beams of charged particles to and away from the beam splitter.

The beam splitter is a particle-optical component having plural subcomponents for providing magnetic field regions therein for deflecting the first and second beams in suitable directions and angles as will be illustrated in more detail below.

The beam splitter has three terminals providing three predefined cross sections through which the first and second beams enter and leave the beam splitter. It is a function of the beam-guiding system to manipulate the first and second beams such that they enter the respective terminal at a predefined position and under a predefined orientation with respect to the beam splitter. Further, it is a function of the beam-guiding system to receive the first and second beams leaving the beam splitter at the respective terminals at predefined positions of acceptance and under predefined angles of acceptance such that the beams may then be further manipulated to perform their desired functions.

The beam splitter provides with its components at least two field regions, wherein a magnetic field of a substantially constant homogeneous strength is provided in each of the at least two field regions, and wherein at least one of the at least two field regions is enclosed by a current conductor for generating the magnetic field of the substantially constant strength therein.

A beam path of the first beam passing through the beam splitter is such that the beam path passes at least three subsequent beam-manipulating regions of different magnetic fields. The three beam-manipulating regions are provided by the at least two field regions.

When seen upon projection onto a main plane of the beam splitter the beam path of the first beam intersects the current conductor enclosing the at least one field region at first and second intersecting positions which have the following property: the current conductor on both sides of the respective intersecting position has a curvature in a same direction. This means that a curve along which the current conductor extends does not show a change of direction of curvature close to the intersecting position. In particular, the intersecting position is not located at a straight line portion of such curve, wherein the curve further extends from both ends of the straight line portion under different directions of curvature.

The inventors recognized that in the conventional beam splitter known from U.S. Pat. No. 5,319,207 a straight line portion of the current conductor having opposite directions of curvature at the ends of the straight line portion is a source of inaccuracies with respect to the optical properties provided for the first beam passing the beam splitter.

When the intersecting position is located at a portion of the current conductor where the same extends under a same direction of curvature away from the intersecting position a location of the current conductor in the region close to the intersecting position may be more precisely defined. This results in a more precise definition of the respective beam-manipulating regions provided for the first beam. Such more precise definition may be also achieved when the intersecting position is located at a straight line portion of the current conductor, wherein, however, at both ends of such straight line portion the current conductor further extends with same directions of curvature.

According to an embodiment, the current conductor enclosing the at least one field region has a same direction of curvature around the whole periphery of the at least one field region. This embodiment may include straight line portions of the current conductor arranged between curve portions having the same direction of curvature.

According to an embodiment, at least one of the beam-manipulating regions is a portion of a field-free field region of the beam splitter in which the magnetic field provided therein has a strength of substantially zero. Such field-free region may be regarded as a so-called drift region which provides an additional degree of freedom to the designer of the beam splitter.

According to a further aspect of the invention there is provided a particle-optical arrangement comprising a beam splitter and a beam-guiding system with the general functions as illustrated above. The beam splitter provides at least three field regions, each of which is completely enclosed by a separate current conductor for generating the magnetic field of the substantially constant field strength which is different from zero therein. This allows for designs of the particle-optical arrangement such that advantageous optical properties are achieved.

According to a further aspect of the invention there is provided a particle-optical arrangement comprising a beam splitter and a beam-guiding system with the general functions as illustrated above. At least one of the beam-manipulating regions is a portion of a field-free region in which the magnetic field has a strength of substantially zero.

The beam splitter and the beam-guiding system are further configured such that, when seen upon projection onto the main plane of the beam splitter, the first beam enters and leaves the field-free region under different angles of intersection with the respective current conductor. The different angles allow for degrees of freedom for the design of the beam splitter while the field-free region does not contribute to an energy dispersion of the beam splitter.

According to an embodiment the beam-manipulating regions of the beam splitter are disposed symmetrically with respect to a plane of symmetry extending orthogonally to a plane of the beam splitter.

According to a further aspect the invention provides a particle-optical arrangement comprising a beam splitter and a beam-guiding system with the general functions as illustrated above. The beam splitter and the beam-guiding system are configured such that the beam path of the first beam through at least three beam-manipulating regions is substantially symmetrical with respect to an axis extending perpendicularly through the main plane of the beam splitter.

Such highly symmetrical beam path of the first beam allows for comparatively good optical properties such as a low distortion or energy dispersion or astigmatism.

According to an embodiment the first beam enters the beam splitter along substantially a same axis as it leaves the beam splitter.

The magnetic fields in adjacent beam-manipulating regions preferably extend in opposite directions.

According to a preferred embodiment of the invention both the first and second beams pass through the beam splitter substantially free of distortion, energy dispersion and astigmatism.

Herein, the beam splitter preferably provides five beam-manipulating regions which are portions of three field regions providing magnetic fields of substantially constant strength. It is then further preferred that one field region of the three field regions is a field-free region providing a drift region for the respective beams.

According to a preferred embodiment the three field regions are arranged as a central field region which is enclosed by an intermediate field region, which in turn is enclosed by an outer field region.

According to a preferred embodiment, the beam-guiding system comprises a dispersion member disposed in a beam path of the second beam downstream of the beam splitter wherein the dispersion member provides a dispersion for the second beam. This allows for a high resolution examination of kinetic energies of charged particles contained in the second beam. For this purpose, a position sensitive detector is preferably provided downstream of the dispersion member.

According to a further preferred embodiment, the beam-guiding system comprises a charged-particle source for generating the first beam.

According to an embodiment therein the charged-particle source emits the charged particles forming the first beam in a direction which is oriented transversely with respect to a direction of the first beam when it leaves the beam splitter through the first terminal.

According to a further preferred embodiment the beam-guiding system comprises an objective arrangement disposed in the beam path of the first beam downstream of the first terminal of the beam splitter wherein the objective arrangement is provided for focusing the first beam in an object plane of the objective arrangement and for guiding secondary electrons emanating from a region about the object plane as the second beam to the first terminal of the beam splitter. Such arrangement may be advantageously used in an electron microscopy system of a scanning electron microscope type (SEM) wherein the advantageous optical properties of the beam splitter provided for the first beam allow for a formation of comparatively small primary electron beam spots on the objects. The small primary electron beam spots allow for a high resolution of the system.

On the other hand, in a preferred embodiment the beam-guiding system comprises an objective arrangement disposed in the beam path of the second beam downstream of the first terminal of the beam splitter wherein the objective arrangement is provided for directing the second beam to an object plane of the objective arrangement and for guiding secondary electrons emanating from the object as the first beam to the first terminal of the beam splitter. Such arrangement is advantageously used in an electron microscopy system of a low energy emission microscope type (LEEM) or a secondary electron emission microscope type (SEEM) wherein a larger field in the object plane is illuminated by primary electrons provided by the second beam, and wherein a secondary electron image of the illuminated field is imaged onto a two-dimensional position sensitive detector. The advantageous optical properties provided by the beam splitter to the first beam allow for a high-quality electron-optical image of the object detected by the detector.

According to a further preferred embodiment the particle-optical arrangement is used in a lithography system for transferring a pattern onto an object in a lithographic process.

BRIEF DESCRIPTION OF THE DRAWINGS

The forgoing as well as other advantageous features of the invention will be more apparent from the following detailed description of exemplary embodiments of the invention with reference to the accompanying drawings, wherein FIG. 1 schematically shows an electron microscope of the SEM type with a beam splitter providing advantageous optical properties to a primary electron beam path thereof.

DETAILED DESCRIPTION OF EXEMPLARY EMBODIMENTS

Figure 1:
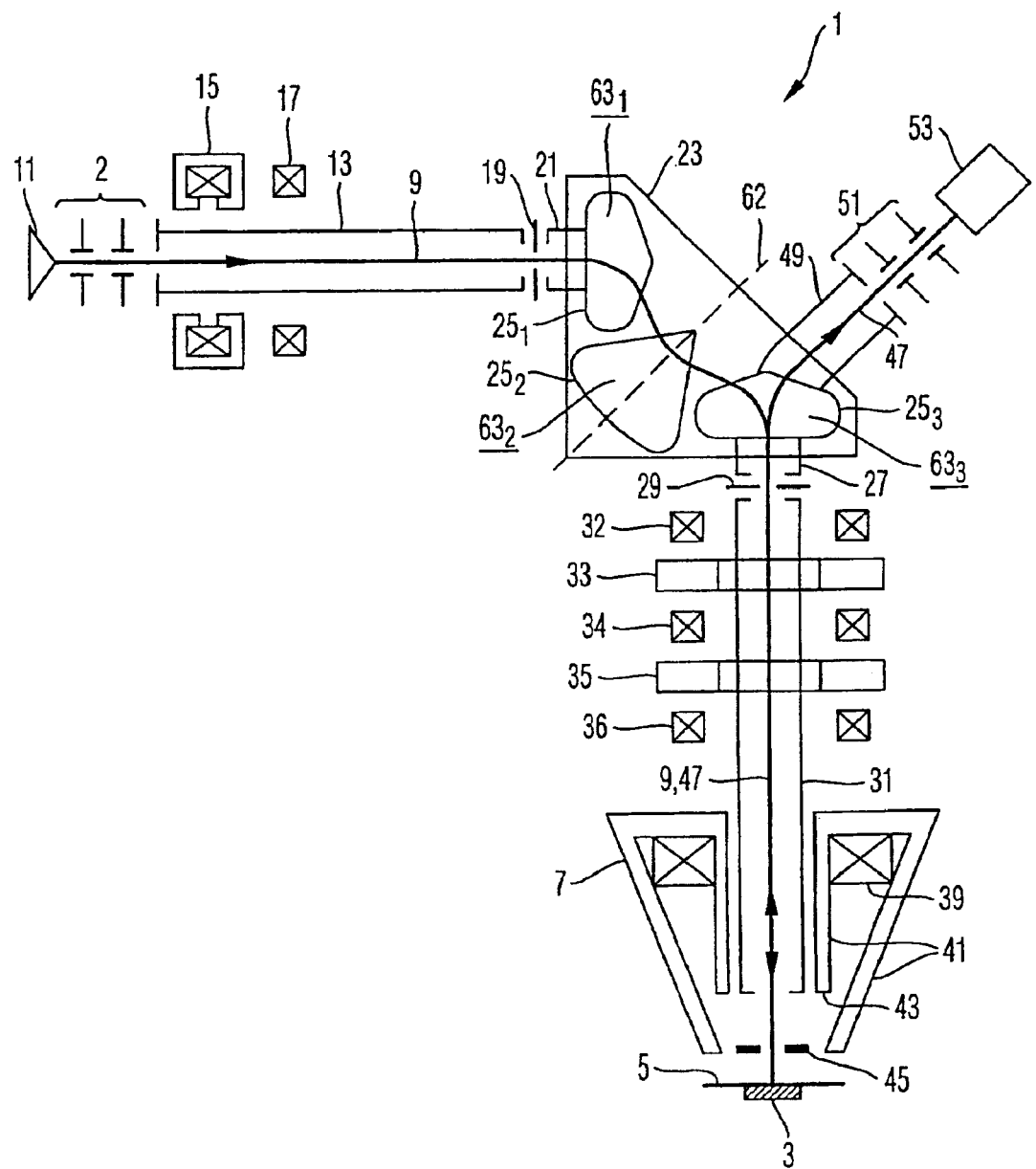

FIG. 1 illustrates an electron microscopy system 1 of the SEM type for inspecting an object 3 positioned in an object plane 5 of an objective lens arrangement 7 of the electron microscopy system 1.

A primary electron beam 9 is generated by an electron source 11 emitting beam 9 in a horizontal direction in FIG. 1. Downstream of electron source 11 there is an accelerator/deflector arrangement 2 positioned in the primary electron beam path for accelerating the beam to a desired energy and for adjusting a direction and position thereof such that the beam may correctly pass through the components positioned further downstream in the primary electron beam path. Downstream of the accelerator/deflector arrangement 2 the beam enters a beam tube 13 wherein a focusing lens 15 and a stigmator 17 are positioned around beam tube 13 for performing further beam shaping of the primary electron beam 9. Downstream of beam tube 9 the primary electron beam passes an aperture 19 which may also perform a function of an Einzel-lens in combination with a further beam tube 21 provided downstream of aperture 19 and forming an entrance terminal for the primary electron beam 9 to enter a beam splitter 23.

The beam splitter 23 comprises three magnetic pole shoes $25_1$, $25_2$, $25_3$ which the primary electron beam passes in that order, wherein pole shoe $25_1$ deflects the beam to the right, pole shoe $25_2$ deflects the beam to the left, and pole shoe $25_3$ deflects the primary electron beam to the right such that the primary electron beam, when leaving the beam splitter through a beam tube 27 is deflected by the combination of all three pole shoes $25_1$, $25_2$, $25_3$ by about 90° to the right with respect to its direction when entering the beam splitter 23, such that the beam path of the primary electron beam 9 extends vertically downwards in FIG. 1. Beam tube 27 forms an exit terminal of beam splitter 23 for the primary electron beam 9.

After leaving the beam splitter through terminal 27 the primary electron beam is accelerated by an Einzel-lens 29 before entering a beam tube 31 extending down into objective lens arrangement 7. Along the beam tube 31 there is arranged a plurality of beam shaping electron-optical elements schematically indicated in FIG. 1 by reference numerals 32 to 36 and comprising deflectors, quadrupole elements and hexapole elements for shaping and aligning the primary electron beam before the same enters into objective lens arrangement 7.

Objective lens arrangement 7 comprises a magnetic coil 39 with pole shoes 41 forming a pole shoe gap 43 for providing a focusing magnetic field for the primary electron beam. The objective lens arrangement 7 further comprises an electrode 45 providing an electrical field between an end of beam tube 31 and between the object 3. These electrical fields have a further focusing effect on the primary electron beam and decelerate the primary electrons passing through beam tube 31 and the pole shoe gap 43 at high energies to low kinetic energies such that a desired landing energy of the primary electrons on the object 3 is obtained.

Voltages supplied to beam tubes 13, 21, 27, 31 and electrodes 19, 29 and 45 and the voltage supplied to the object 3 may be individually adjusted by a controller (not shown in FIG. 1). Under such control it is possible that the primary electron beam passes beam tube 13 and the beam forming elements 15, 17 located in a region thereof, and beam tube 31 and the beam shaping elements 32 to 36 and a portion of objective lens arrangement located in a region thereof at a high kinetic energy such that an effect of the Coulomb interaction between electrons forming the beam has a reduced effect in deteriorating a resolution of microscopy system 1. Further, a kinetic energy with which the primary electron beam passes beam splitter 23 may be adjusted to an energy suitable for performing the beam splitting function with pole shoes $25_1$, $25_2$, $25_3$, i.e. to an energy for which a performance of beam splitter 23 is optimized. Further, the landing energy of the primary electrons on object 3 may be adjusted and changed according to the demands of a user under such control.

Secondary electrons emanating from object 3 are accelerated by electrode 45 and enter into the objective lens arrangement 7 which collimates the secondary electrons to form a secondary electron beam 47. A beam path of the secondary electron beam 47 passes through the beam shaping elements 32 to 36 within beam tube 31 and enters the beam splitter 23 through beam tube 27 forming an entrance terminal of the beam splitter 23 for the secondary electron beam. The secondary electron beam then passes through pole shoe $25_3$ which deflects the same to the right such that the secondary electron beam path which coincides with the secondary electron beam path between terminal 27 and objective lens arrangement is separated from the primary electron beam path. The secondary electron beam then enters into a beam tube 49 forming an exit terminal of the beam splitter 23 for the secondary electron beam. Downstream of beam tube 49 there is provided a lens arrangement 51 for projecting the secondary electron beam onto a detector 53.

Figure 2:
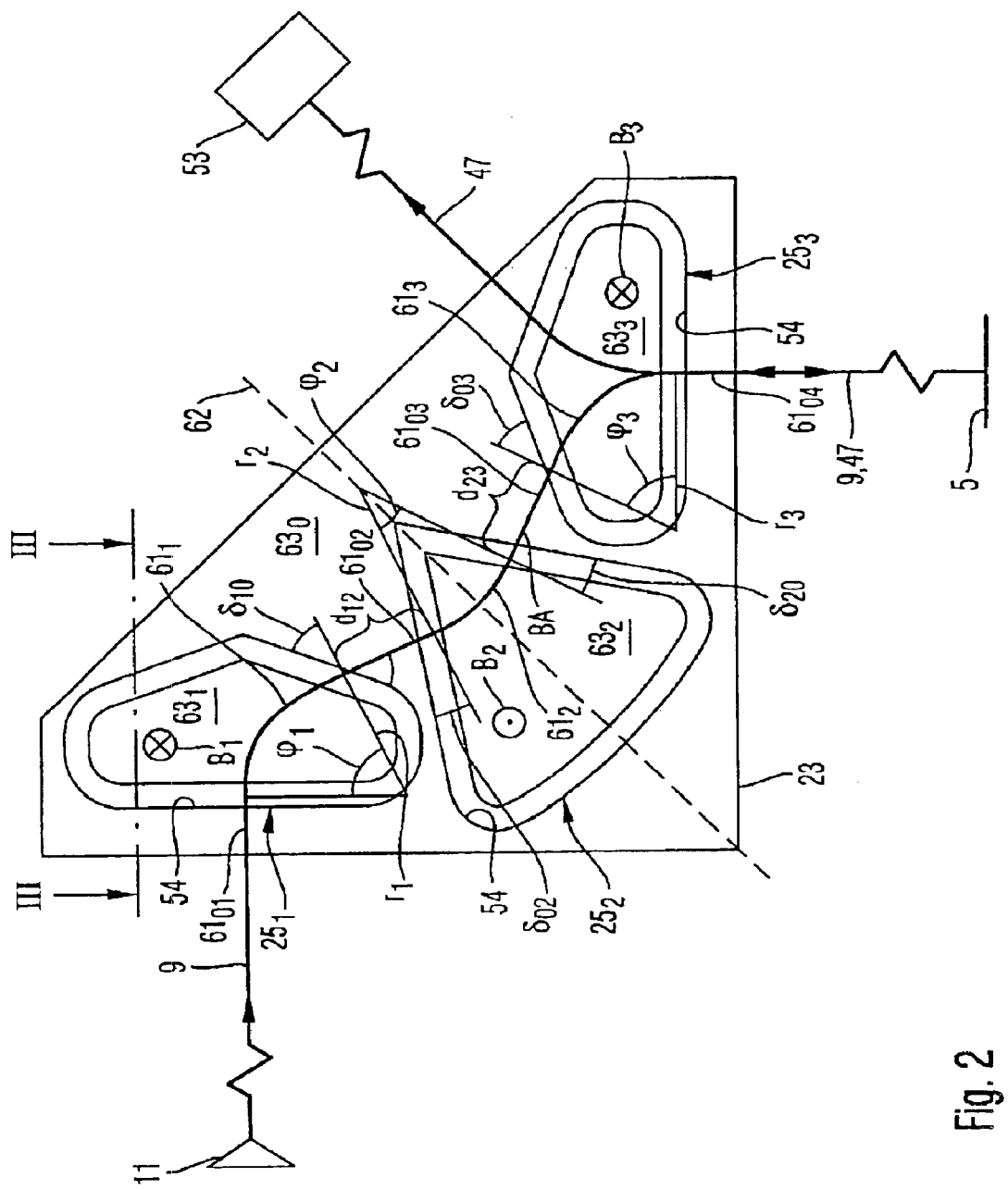
FIG. 2 schematically shows details of an arrangement of magnetic field regions of the beam splitter shown in FIG. 1.
Figure 3:
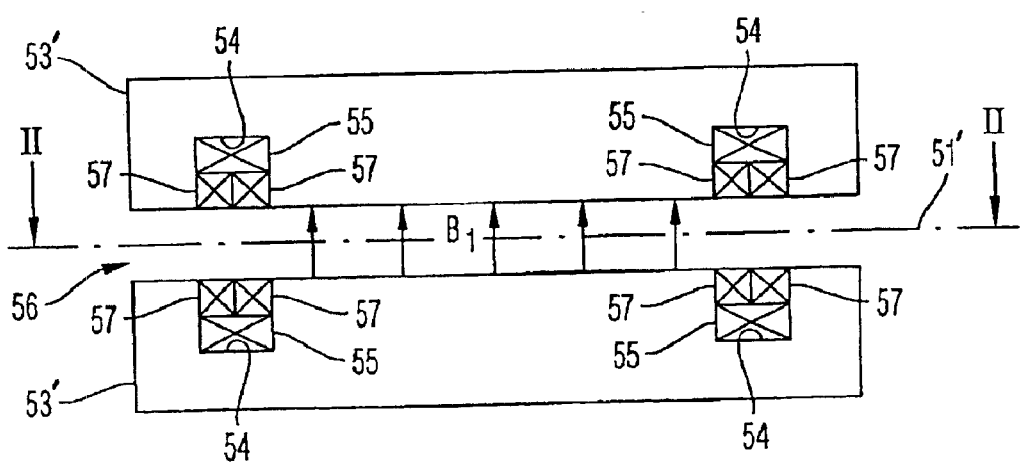
FIG. 3 schematically shows a cross-section through a field region of the beam splitter along a line III—III shown in FIG. 2.

FIG. 2 is a more detailed illustration of the primary electron beam path through beam splitter 23, and FIG. 3 is an illustration of a cross section through beam splitter 23 along line III—III of FIG. 2.

Beam splitter 23 has a main plane 51' in which the primary and secondary electron beams 9, 47 pass through the beam splitter. Symmetrically with respect to main plane 51' and with a distance therefrom there are provided pole shoe plates 53' having grooves 54 formed therein. Main current conductors 55 are inserted in grooves 54. The main current conductors 55 are supplied with an energizing current from a current source (not shown in the figures) to provide a magnetic field B in a gap 56 between pole shoe plates 53'. Further, compensating current conductors 57 are inserted in the grooves 54 for providing a fine adjustment of magnetic field B provided in the gap. Thus, the current source for energizing the main current conductor 54 may be a high current source of a lower accuracy, and the current source for energizing the compensating conductors 57 will be a low current source of a higher accuracy, and the magnetic field B may be adjusted to a desired field strength with high accuracy.

The primary electron beam passes through a plurality of beam-manipulating regions 61 (e.g., $61_1$, $61_2$, etc.) provided by plural magnetic field regions 63 (e.g., $63_1$, $63_2$, etc.) within the beam splitter 23. In the example of FIG. 2, there are four different magnetic field regions $63_0$, $63_1$, $63_2$ and $63_3$. Magnetic field region $63_1$ comprises beam-manipulating region $61_1$ provided by pole shoe $25_1$ in an inferior of a current conductor provided in groove 54. Similarly, pole shoe $25_2$ provides a magnetic field region $63_2$ in an interior of a respective current conductor enclosing region $63_2$, and pole shoe $25_3$ provides a magnetic field region $63_3$. A field-free region $63_0$ is provided outside of the closed current conductors defining magnetic field regions $63_1$, $63_2$, $63_3$. In field-free region $63_0$ a magnetic field having a field strength of substantially zero is provided, and within field regions $63_1$, $63_2$, $63_3$ the magnetic field provided therein is a substantially homogeneous magnetic field, wherein the magnetic fields provided in field regions $63_1$ and $63_3$ have a substantially same field strength and are oriented in a same direction perpendicularly to the paper plane of FIG. 2, whereas the magnetic field $B_2$ provided in field region $63_2$ is oriented in an opposite direction thereto.

After entering the beam splitter 23 through terminal 21 the primary electron beam 9 at first passes a beam-manipulating region $61_{01}$ provided by field-free region $63_0$ of the beam splitter 23. In fact, the beam-manipulating region $61_{01}$ does not change a direction of the beam and may be regarded as a drift space for the beam such that no manipulation at all takes place. However, in the terminology of the present application such drift space $61_{01}$ is also referred to as beam-manipulating region since a length thereof and an angle under which the beam passes through boundaries of adjacent field manipulating regions are degrees of freedom which the designer of the beam splitter may use for obtaining the desired optical properties of the beam splitter 23.

After passing beam-manipulating region $61_{01}$ the primary electron beam enters a beam-manipulating region $61_1$ provided by magnetic field region $63_1$. At an interface between regions $61_{01}$ und $61_1$ the current conductor in groove 54 extends perpendicularly to the beam path. Within beam-manipulating region $61_1$ the primary electron beam is deflected by an angle $\phi_1$ with an radius of curvature $r_1$. Thereafter, the primary electron beam leaves beam-manipulating region $61_1$ under an angle $\phi_{10}$ with respect to an extension of the current conductor in groove 54 and enters beam-manipulating region $61_{02}$ which forms a drift space having a length $d_{12}$. The beam leaves region $61_{02}$ and enters a beam-manipulating region $61_2$ provided by field region $63_2$ under an angle $\delta_{02}$ with respect to an extension of a boundary between regions $61_{02}$ and $61_2$. In region $61_2$ the beam is deflected to the left by an angle $\phi_2$ and with a radius of curvature $r_2$. The beam then leaves region $61_2$ and enters the beam-manipulating region $61_{03}$ provided the field-free region $63_0$ under an angle $\delta_{20}$ with respect to a direction of extension of a boundary between regions $61_2$ and $61_{03}$. Thereafter, the beam leaves region $61_{03}$ and enters beam-manipulating region $61_3$ provided by field region $63_3$ under an angle $\delta_{03}$ with respect to an extension of a boundary between regions $61_{03}$ and $61_3$. In beam-manipulating region $61_3$ the beam is deflected by an angle $\phi_3$ with a radius of curvature $r_3$. Thereafter the beam leaves region $61_3$ and enters beam-manipulating region $61_{03}$ provided by field-free region $63_0$ under an angle $\delta_{30}$ of 90° with respect to a boundary between regions $61_3$ and $61_{03}$. The beam-manipulating region $61_{03}$ provides a drift space before the primary electron beam leaves beam splitter 23 through exit terminal 27.

Exemplary physical values of the parameters shown in FIG. 2 are given in Table 1 below for an embodiment of the beam splitter shown in FIG. 2.

TABLE 1

| $r_1 = r_3$ | $r_2$ | $D_{12} = d_{23}$ | $\phi_1 = \phi_3$ | $-\phi_2$ | $\delta_{10} = -\delta_{03}$ | $\delta_{02} = -\delta_{20}$ |
|---|---|---|---|---|---|---|
| 13.7 mm | 13.7 mm | 16.7 mm | 71.5° | 52.9° | 57.5° | 2.4° |

As can be seen from the above parameters, the beam splitter 23 has a high symmetry with respect to a plane of symmetry 61 transversely oriented to main plane 51'.

Beam splitter 23 may be designed such that it provides the following advantageous optical properties for the primary electron beam path: The beam splitter is, in first order and/or second order, free of dispersion, astigmatism and distortion, wherein these properties are, in first order and/or second order, not affected by changes of a position of an image or intermediate image formed in the primary electron beam upstream (or downstream) of the beam splitter.

Each of the grooves 54 shown in FIG. 2 encloses its respective field region 63 in a completely convex shape, i.e. without any concave curve portions. Even though there are straight line portions of extension of the grooves, such straight line portions are at both ends followed by a convex portion such that a change of curvature does not occur within the straight line portion. Such extension of the grooves allow positioning the current conductor within the groove with a close and continuous contact to an inner sidewall of the groove which may be machined with a high precision. Thus, the current conductor exactly follows the extension of the sidewall and is thus positioned with a high accuracy resulting in an accurate definition of the respective magnetic field regions 63 and beam-manipulating regions 61, accordingly.

The magnetic field regions $63_1$, $63_2$, $63_3$ are the only beam deflecting magnetic field regions of the beam splitter 23 having a magnetic field strength provided therein which is different from zero. Also the electron microscopy system 1 does not comprise any further beam deflecting magnetic field regions apart from those contained in the beam splitter 23. The term "further beam deflecting magnetic field regions" shall comprise magnetic field regions which are provided for providing a substantial deflection angle to the beams and shall not comprise such field regions which are merely present for some other purposes such as providing a possibility of a fine adjustment of the respective beam paths.

Thus, a beam deflecting magnetic field region providing a substantial angle of deflection will be a field region providing a deflection angle higher than 5°, in particular higher than 10° and in particular higher than 15°.

In the following further embodiments will be illustrated. Herein, components which correspond in function or structure to components of the embodiments illustrated with reference to FIGS. 1 to 3 are designated by the same reference numbers, however, supplemented by an additional letter for the purpose of distinction. Reference is made to the entire above description.

Figure 4:
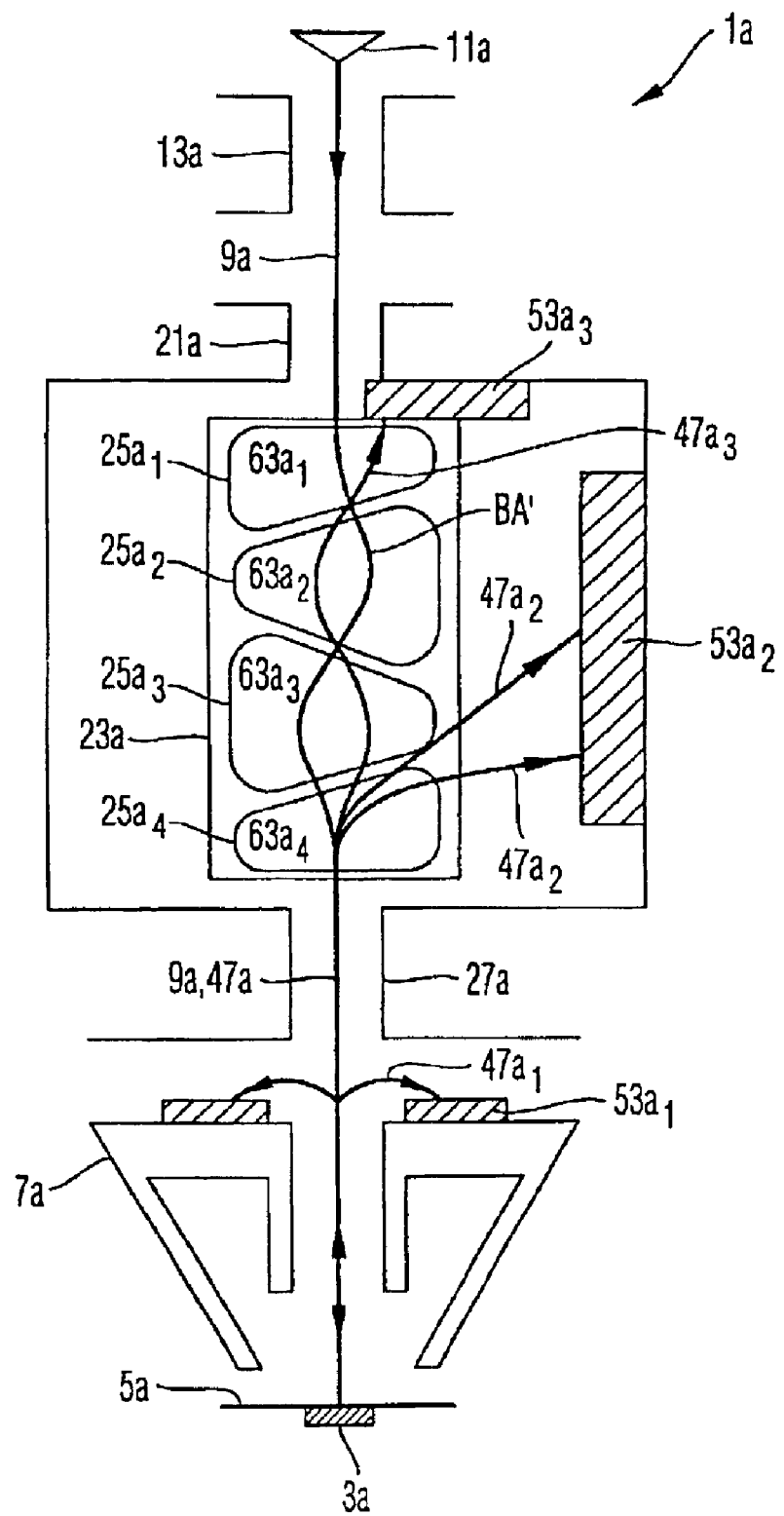
FIG. 4 schematically shows an electron microscope of the SEM type with a beam splitter.
Figure 5:
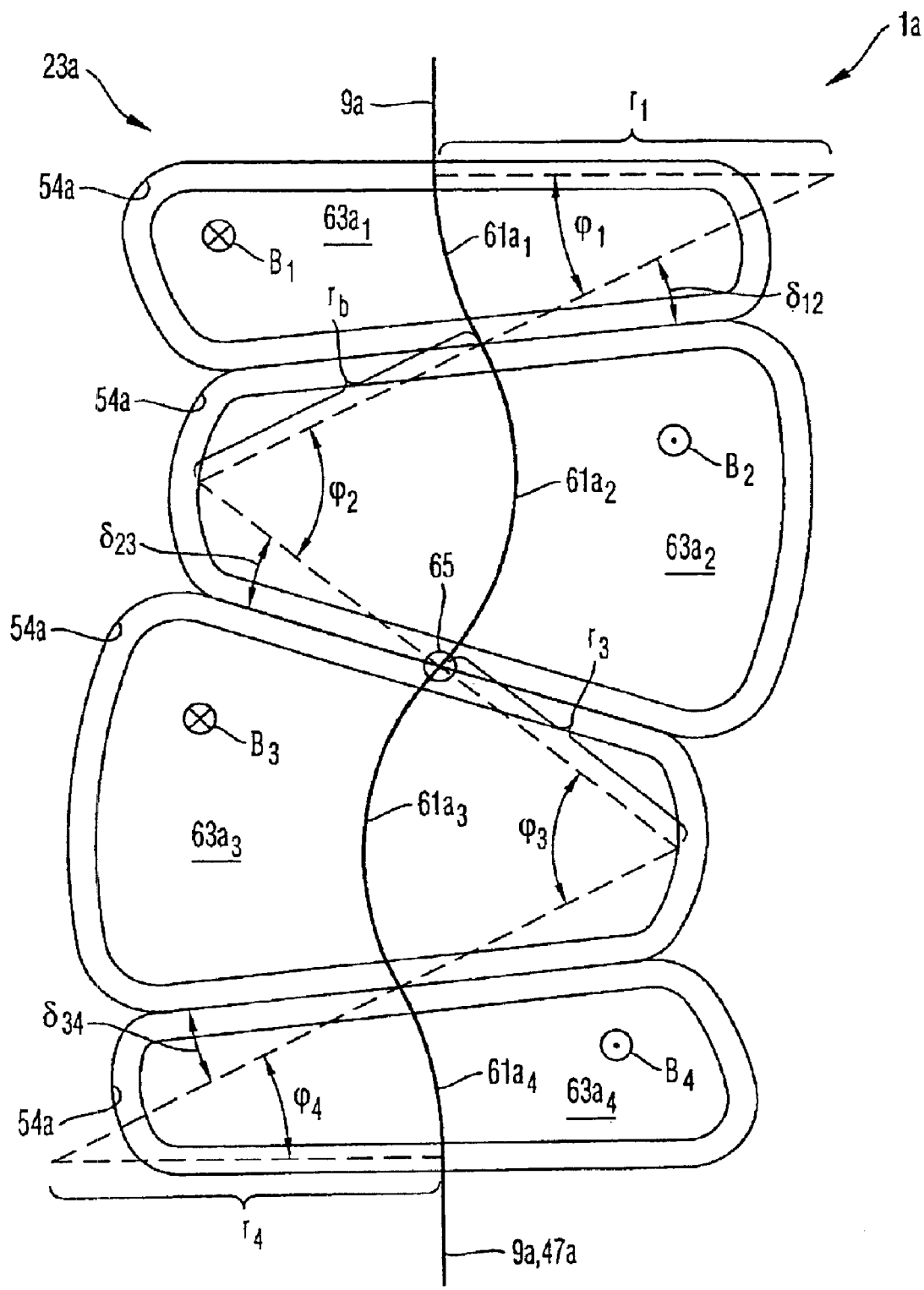
FIG. 5 schematically shows details of an arrangement of magnetic field regions of the beam splitter shown in FIG. 4.

FIGS. 4 and 5 show a further embodiment of an electron microscopy system $1a$ of the SEM type having a beam splitter $23a$ for separating a beam path of a primary electron beam $9a$ from a beam path of a secondary electron beam $47a$. For the primary electron beam $9a$ the beam splitter $23a$ provides a high optical quality by providing four subsequent beam-manipulating regions $61a_1$, $61a_2$, $61a_3$, $61a_4$ for the primary electron beam. The beam-manipulating regions $61a_1$, $61a_2$, $61a_3$, $61a_4$ are provided by respective magnetic field regions $63a_1$, $63a_2$, $63a_3$, $63a_4$, which are each enclosed by a respective groove $54a$ receiving respective current conductors for generating magnetic fields $B_1$, $B_2$, $B_3$ and $B_4$, respectively in the magnetic field regions $63a$. The magnetic fields in field regions $63a_1$, $63a_2$, $63a_3$, $63a_4$ are each substantially homogeneous fields oriented transversely to a main plane of beam splitter $23a$. Magnetic fields of directly adjacent ones of the magnetic field regions $63a_1$, $63a_2$, $63a_3$, $63a_4$ are oriented in opposite directions.

Beam-manipulating region $61a_1$ deflects the primary electron beam by an angle $\phi_1$ to the left. The primary beam then leaves region $61a_1$ to enter adjacent region $61a_2$ under an angle $\delta_{12}$ with respect to an orientation of a boundary between regions $61a_1$ and $61a_2$. Beam-manipulating region $61a_2$ deflects the primary electron beam by an angle $\phi_2$ to the left with a radius of curvature $r_2$, and the primary electron beam then leaves field region $61a_2$ to enter adjacent field region $61a_3$ under an angle $\delta_{23}$. Thereafter the primary electron beam is deflected by beam-manipulating region $61a_3$ under an angle $\phi_3$ to the left and subsequently by beam-manipulating region $61a_4$ by an angle $\phi_4$ to the right such that an axis of the primary electron beam $9a$ when leaving the beam splitter $23a$ is collinear with a beam axis of the primary electron beam $9a$ when entering the beam splitter $23a$.

Exemplary physical parameters of the embodiment of beam splitter $23a$ shown in FIG. 5 are given in Table 2 below.

TABLE 2

| | Parameters | | | | | |
|---|---|---|---|---|---|---|
| | $r_1 = r_4$ | $r_2 = r_3$ | $\phi_1 = -\phi_4$ | $-\phi_2 = \phi_3$ | $\delta_{12} = \delta_{34}$ | $-\delta_{23}$ |
| Value | 20 mm | 20 mm | 29.7° | 71.4° | 23.3° | 22.4° |

From FIG. 5 and Table 2 it is apparent that the arrangement of beam splitter 23 is inversion symmetric with respect to an axis 65 extending perpendicular to the main plane of beam splitter $23a$. The symmetric arrangement of beam splitter $23a$ provides the following optical properties on primary electron beam $9a$: The beam splitter is, in first order and/or second order, free of dispersion, astigmatism and distortion, wherein these properties are, in first order and/or second order, not affected by changes of a position of an image or intermediate image formed in the primary electron beam upstream (or downstream) of the beam splitter.

Compared to the beam splitter shown in FIGS. 1 and 2, beam splitter $23a$ does not comprise substantial drift spaces free of deflecting magnetic fields located in-between adjacent magnetic field regions $63a_1$, $63a_2$, $63a_3$, $63a_4$, resulting in a loss of degrees of freedom in the design. This is compensated by one additional magnetic field region such that the beam splitter has four magnetic field regions rather than three regions which are provided in the beam splitter of FIGS. 1 and 2.

Further, the electron microscopy system $1a$ may be easily adjusted since an adjustment of components different from the beam splitter $23a$ is already possible while the beam splitter $23a$ itself is not adjusted. When the field regions $63a_1$, $63a_2$, $63a_3$, $63a_4$ are not energized, the primary electron beam will already pass through the beam splitter and, for instance, the objective lens arrangement may then be easily adjusted.

FIG. 4 also indicates beam paths $47a_1$, $47a_2$ and $47a_3$ of secondary electrons emanating from object $3a$. Secondary electrons of a particularly low kinetic energy may not be formed to a secondary electron beam such that they even reach beam splitter $23a$. They may be incident on a detecting portion $53a_1$ of a detector positioned between objective arrangement $7a$ and beam splitter $23a$. Secondary electrons of a medium kinetic energy range are deflected by magnetic field portion $63a_4$ to the right such that they leave the beam splitter without further interaction with magnetic field portion $63a_3$. A position-sensitive detecting portion $53a_2$ of the detector is provided for detecting those secondary electrons $47a_2$ wherein an energy-sensitive detection of secondary electrons is achieved by position-sensitive detector $53a_2$.

Secondary electrons $47a_3$ with an even higher energy are deflected by magnetic field portion $63a_4$ to the right with an angle such that they may not directly leave the beam splitter and enter subsequent magnetic field portion $63a_3$ which deflects them to the left. They then enter magnetic field portion $63a_2$ deflecting them to the right, and magnetic field portion $63a_1$ deflecting them to the left. Different from the beam path of the primary electron beam the beam path of the secondary electron beam $47a_3$ is not inversion symmetric with respect to axis 65 such that beam $47a_3$ may not exit from the beam splitter along a same axis as it enters the beam splitter. A further detector portion $53a_3$ is positioned such that secondary electron beam $47a_3$ is incident thereon for detection.

Apart from the magnetic field regions $63a_1$, $63a_2$, $63a_3$ and $63a_4$ the beam splitter $23a$ and the electron microscopy system $1a$ do not comprise any further magnetic field regions in the beam path of the primary electron beam which further magnetic field regions provide substantial angles of deflection as defined above.

Figure 7:
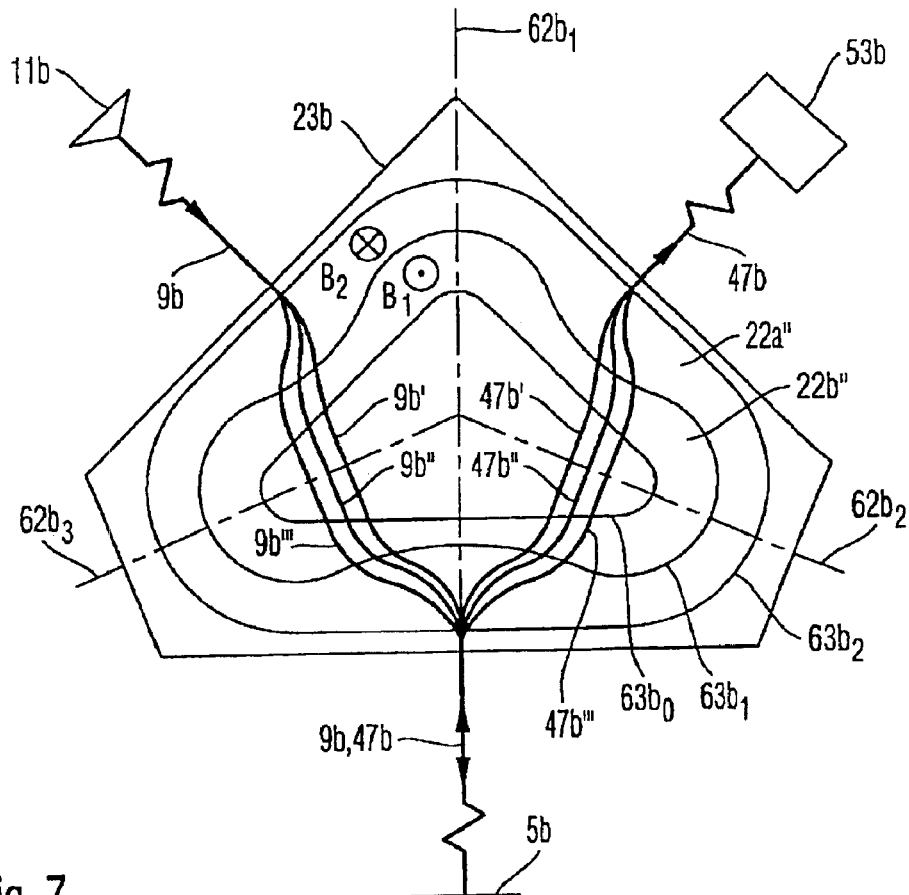
FIG. 7 schematically shows details of an arrangement of magnetic field regions of the beam splitter shown in FIG. 6.
Figure 6:
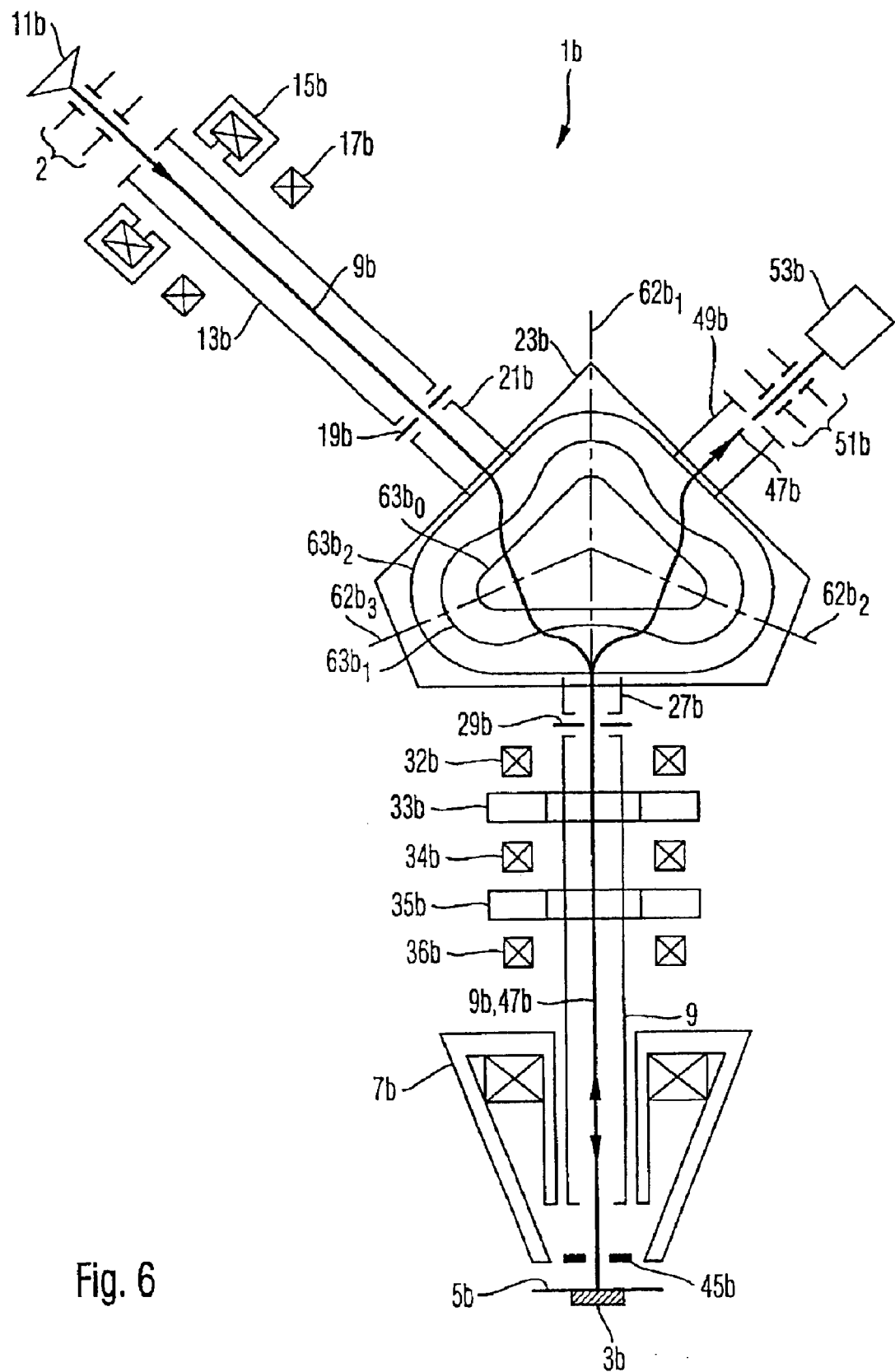
FIG. 6 schematically shows an electron microscope of the SEM type with a beam splitter providing a symmetry between primary and secondary electron beam paths.
Figure 8:
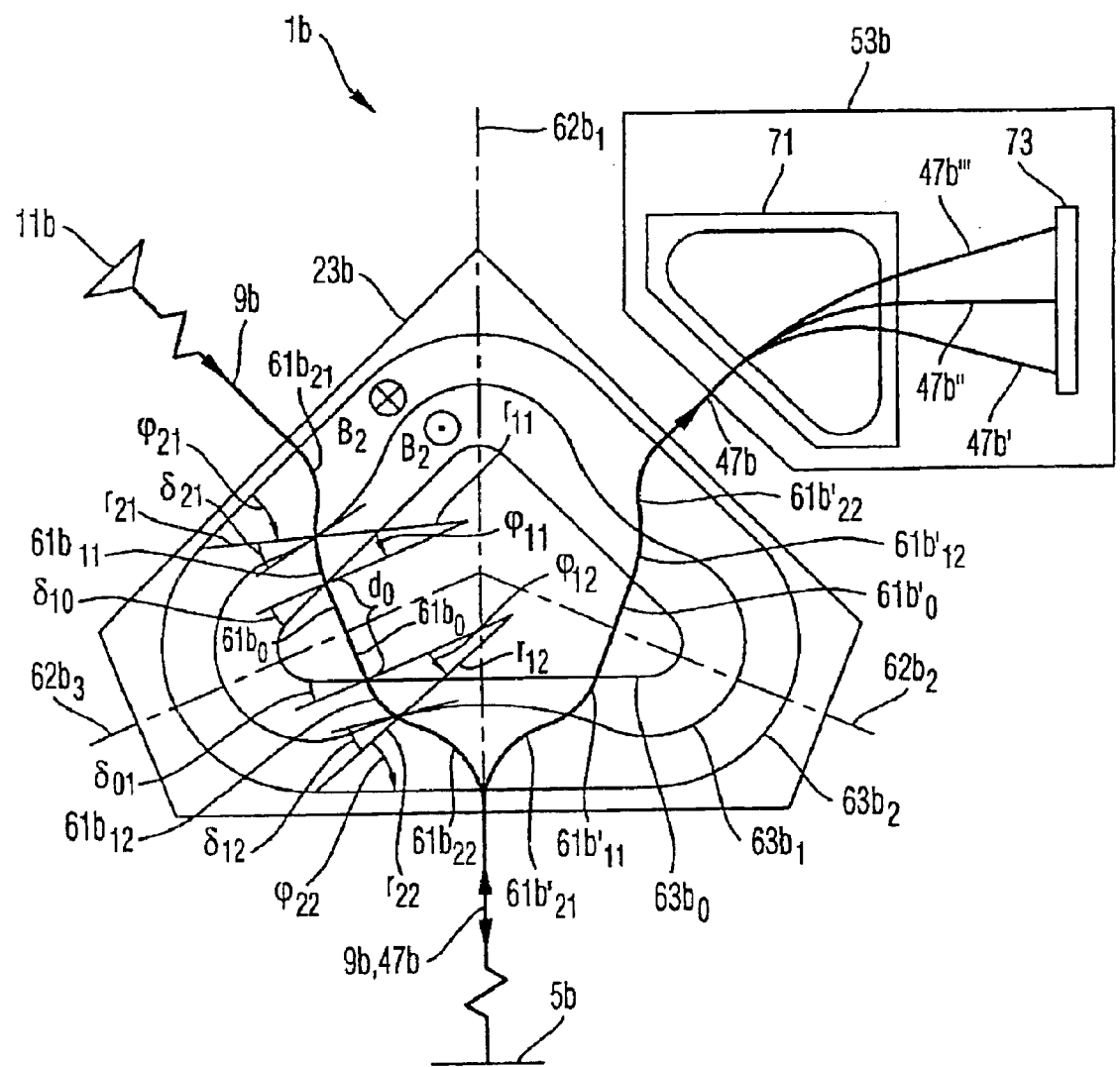
FIG. 8 schematically shows details of a variant of the electron microscope illustrated in FIGS. 6 and 7.

A further electron microscopy system $1b$ having a beam splitter $23b$ is shown in FIGS. 6, 7 and 8. Again, a beam splitter $23b$ is provided for separating a beam path of a primary electron beam $9b$ from a beam path of a secondary electron beam $47b$. The beam splitter $23b$ provides a central field-free magnetic field region $63b_0$ which provides a substantially homogeneous magnetic field of a field strength of substantially zero. Central magnetic field region $63b_0$ is enclosed by an intermediate magnetic field region $63b_1$ in which a substantially homogeneous magnetic field oriented transversely to the paper plane of FIGS. 6 and 7 is provided. Further, intermediate field region $63b_1$ is enclosed by an outer field region $63b_2$ in which a substantially homogeneous magnetic field $B_2$ of an orientation opposite to magnetic field $B_1$ of intermediate field region $63b_1$ is provided.

The arrangement of magnetic field regions $63b$ is substantially symmetrical with respect to a plane of symmetry $62b_1$ extending transversely to the paper plane of FIGS. 6 and 7 and substantially coinciding within the beam path of primary electron beam $9b$ downstream of beam splitter $23b$. The arrangement of the magnetic field regions $63b_0$, $63b_1$ and $63b_2$ has further a partial symmetry with respect to symmetry planes $62b_2$ and $62b_3$ such that only a portion of the magnetic field regions $63b_0$, $63b_1$ and $63b_2$ is close to symmetrically arranged with respect to planes $62b_2$, $62b_3$ of partial symmetry.

Both the primary electron beam and the secondary electron beam are deflected by beam splitter $23b$ in similar opposite angles such that beam splitter $23b$ has advantageous optical properties for both the primary electron beam $9b$ and the second electron beam $47b$.

FIG. 7 indicates an energy dispersion occurring in the beam path of the primary electron beam $9b$ and the beam path of the secondary electron beam $47b$ when passing through beam splitter $23b$. Lines $9b'$, $9b''$ and $9b'''$ indicate energy dispersed beam paths of the primary electron beam $9b$ within the beam splitter wherein the energy dispersed beam paths coincide before the primary electron beam $9b$ leaves the beam splitter $23b$ through the exit window thereof such that the primary electron beam $9b$ leaving the beam splitter $23b$ is a substantially non-energy-dispersed beam.

Similarly lines $47b'$, $47b''$ and $47b'''$ in FIG. 7 indicate energy dispersed beam paths of the secondary electron beam $47b$ wherein the magnetic field regions $63b_0$, $63b_1$ and $63b_2$ are formed such that also the secondary electron beam $47b$ leaves the beam splitter $23b$ through its respective terminal as a beam having substantially no energy dispersion.

Such high optical quality of the secondary electron beam $47b$ downstream of beam splitter $23b$ allows for a high resolution energy analysis of the secondary electrons in the secondary electron beam $47b$ as schematically illustrated in FIG. 8. A detector arrangement $53b$ of the electron microscopy system $1b$ comprises a dispersing magnetic field region 71 and a position sensitive detector 73 such that the secondary electron beam $47b$ is dispersed by magnetic field region 71 to an energy dispersed beam which is indicated in FIG. 8 by beams $47b'$, $47b''$ and $47b'''$ of different energy which are incident on position sensitive detector 73 at different positions thereof such that an energy spectrum of the secondary electron beam $47b$ may be analyzed in dependence of a position dependent electron flux detected by detector 73.

FIG. 8 further indicates details of the arrangement of the magnetic field regions $63b_0$, $63b_1$ and $63b_2$ of beam splitter $23b$. The primary electron beam $9b$ first passes beam-manipulating region $61b_{21}$ provided by outer magnetic field region $63b_2$ and is deflected in region $61b_{21}$, by an angle $\phi_{21}$ to the right with a radius of curvature $r_{21}$. Beam $9b$ then enters a beam-manipulating region $61b_{11}$ provided by intermediate magnetic field region $63b_1$ under an angle $\delta_{21}$ to an extension of a boundary between regions $61b_{21}$ and $61b_{11}$.

In beam-manipulating region $61b_{11}$ the beam is deflected by an angle $\phi_{11}$ to the left with a radius of curvature $r_{11}$. The beam then enters a beam-manipulating region $61b_0$ provided by central magnetic field region $63b_0$ under an angle $\delta_{10}$ with respect to a boundary between regions $61b_{11}$ and $61b_0$. The beam passes a drift space of a length $d_0$ provided in beam-manipulating region $61b_0$ and then enters beam-manipulating region $61b_{12}$ provided by intermediate magnetic field region $63b_1$ under an angle $\delta_{01}$ with respect to a boundary between regions $61b_0$ and $61b_{12}$. The primary electron beam is deflected in region $61b_{12}$ by an angle $\phi_{12}$ and a radius of curvature $r_{12}$. The beam then enters a beam-manipulating region $61b_{22}$ provided by outer magnetic field region $63b_2$ under an angle $\delta_{12}$ with respect to a boundary between regions $61b_{12}$ and $61b_{22}$. The beam is deflected in region $61b_{22}$ by an angle $\phi_{22}$ and a radius of curvature $r_{22}$ such that it leaves the beam splitter $23b$ on the plane of symmetry $61b_1$.

Exemplary physical values of the parameters indicated in FIG. 8 of the embodiment of the electron microscopy system $1b$ are evident from Table 3 below.

TABLE 3

| $r_{21} = r_{22}$ | $r_{11} = r_{12}$ | $d_0$ | $\phi_{12} = \phi_{22}$ | $\phi_{11} = \phi_{12}$ | $\delta_{21} = \delta_{12}$ | $\delta_{10} = \delta_{01}$ |
|---|---|---|---|---|---|---|
| 18.6 mm | 18.6 mm | 22.8 mm | 63.3° | 40.8° | 40.1° | 17.7° |

The beam path of the secondary electron beam $47b$ through beam splitter $23b$ is similar to that of the primary electron beam $9b$. The secondary electron beam subsequently passes a beam-manipulating region $61b'_{21}$ provided by the outer magnetic field region $63b_2$ deflecting the beam to the right, a beam-manipulating region $61b'_{11}$ provided by the intermediate magnetic field region $63b_1$ deflecting the beam to the left, a beam-manipulating drift region $61b'_0$ provided by the central magnetic field region $63b_0$, a beam-manipulating region $61b'_{12}$ provided by the intermediate magnetic field region $63b_1$ deflecting the beam to the left, and a beam-manipulating region $61b'_{22}$ provided by the outer magnetic field region $63b_2$ and deflecting the beam to the right.

It is to be noted that each intersection of the primary electron beam path or the secondary electron beam path with a current conductor defining one or the other of magnetic field regions $63b_0$, $63b_1$ and $63b_2$ is at an intersecting position of the respective current conductor where the current conductor does not show a change of direction of curvature. In particular, changes of direction of curvature for the current conductor enclosing intermediate magnetic field region $63b_1$ take place at positions along the current conductor which are distant from the intersecting positions. In a region on both sides of each intersecting position the current conductor is concavely curved such that a respective center of curvature is positioned away and outside from the intermediate magnetic field region $63b_1$.

Apart from magnetic field regions $63b_2$, $63b_1$ and $63b_0$ (which is a magnetic field region enclosed by a current conductor such that a magnetic field of substantially zero is enclosed therein), the beam splitter $23b$ and the electron microscopy system $1b$ do not comprise further magnetic field regions in the primary and secondary electron beam paths providing substantial angles of deflections as defined above.

Figure 9:
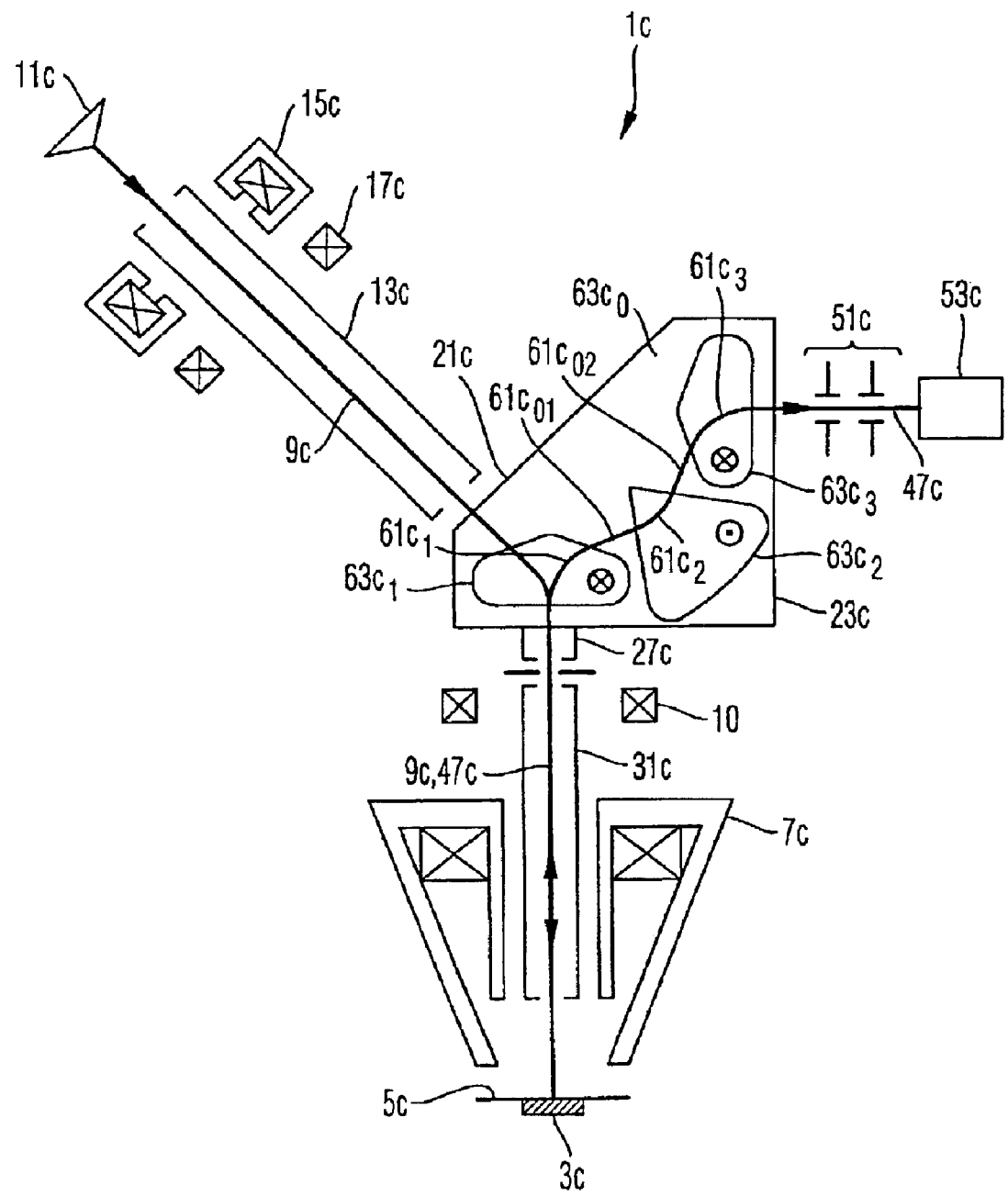
FIG. 9 schematically shows an electron microscope of the LEEM type with a beam splitter providing advantageous optical properties to a secondary electron beam path thereof.

FIG. 9 shows an embodiment of an electron microscopy system 1c of the LEEM type. The electron microscopy system 1c comprises a beam splitter 23c for separating a beam path of a primary electron beam 9c from a beam path of a secondary electron beam 47c. The beam splitter 23c has a configuration similar to that of the beam splitter illustrated with reference to FIGS. 1 and 2 above. However, the beam splitter 23c provides its high-quality optical properties for the secondary electron beam such that the secondary electron beam subsequently passes through beam-manipulating regions $61c_1$, $61c_2$, $61c_3$ provided by respective different magnetic field regions $63c_1$, $63c_2$, $63c_3$ and separated from each other by respective beam-manipulating drift regions $61c_{01}$ and $61c_{02}$ provided by a magnetic field-free region $63c_0$.

With such high-quality beam splitter it is possible to image an object plane 5c onto an electron sensitive detecting surface of a two-dimensional position-sensitive secondary-electron detector 53c such that detector 53c may detect an electron-optical image of an extended region of an object 3c positioned with its surface coinciding with object plane 5c at a same time without scanning the primary electron beam 9c.

In the electron microscopy system 1c the primary electron beam 9c illuminates the extended region on object 3c. For providing a sufficient illumination of the object 3c with the primary electron beam 9c the beam splitter provides to the primary electron beam 9c optical properties which are substantially interior when compared to the optical properties provided for the secondary electron beam 47c.

Apart from magnetic field regions $63c_1$, $63c_2$ and $63c_3$ the beam splitter 23c and the microscopy system 1c do not comprise further magnetic field regions in the beam path of the secondary electron beam 47c for providing a substantial angle of deflection as defined above.

Figure 10:
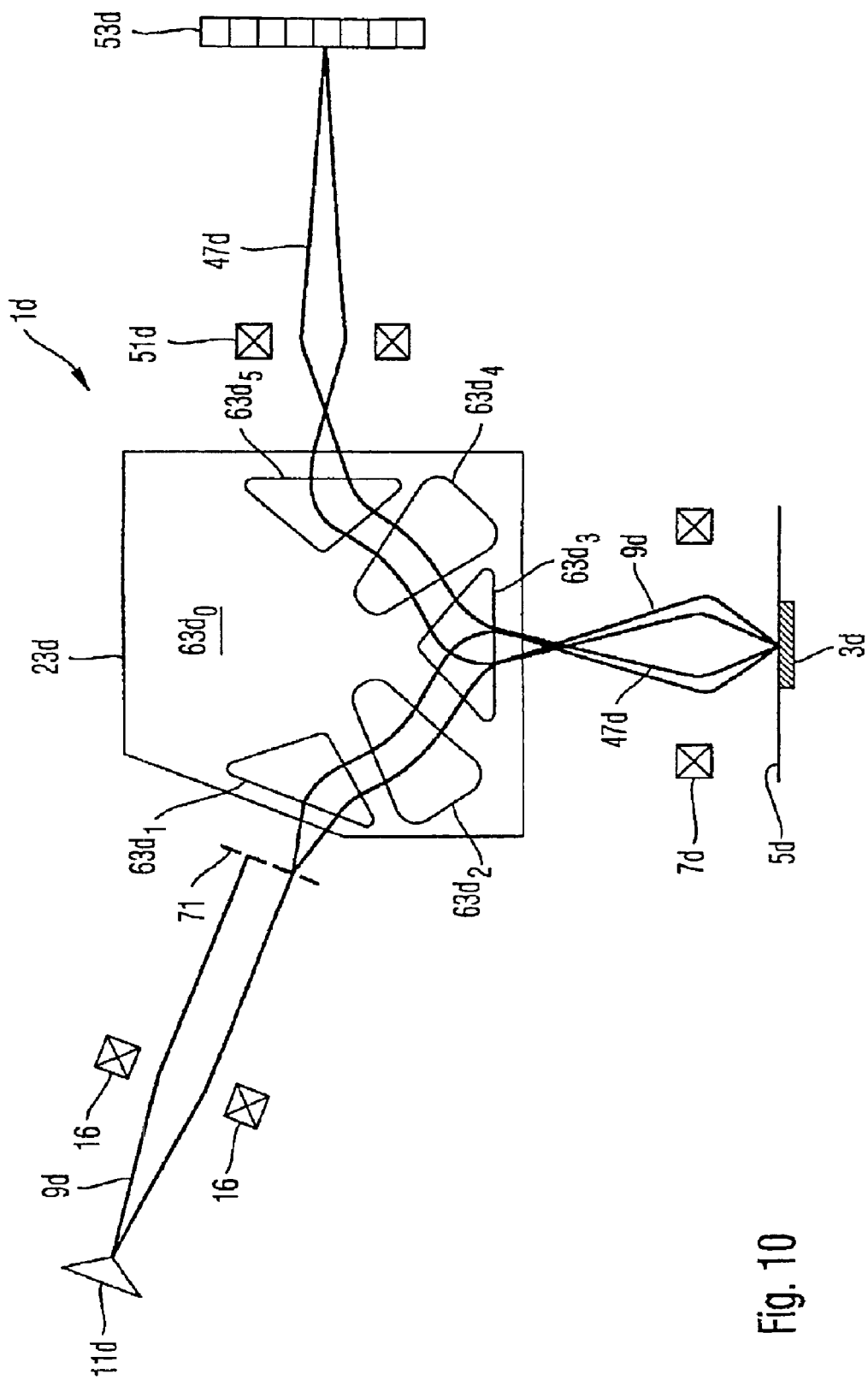
FIG. 10 schematically shows a lithography apparatus with a beam splitter providing advantageous optical properties to a writing electron beam thereof.

FIG. 10 shows an electron lithography system 1d comprising an electron beam source 11d for generating a writing beam 9d which is collimated by collimating optics 16 to be incident on a reticle 71 on which a pattern is provided which is to be imaged by writing beam 9d onto a wafer 3d arranged in an object plane 5d of an objective arrangement 7d. The reticle 71 may provide a scattering mask or a stencil mask or some other type of mask for representing the pattern to be imaged onto the wafer.

The lithography system 1d further comprises a position sensitive detector 53d onto which that region of object 3d is electron-optically imaged onto which the pattern provided by reticle 71 is imaged. Such imaging onto the detector is performed by a secondary electron beam 47d formed from secondary electrons emanating from the object 3d. Thus, the electrons of the writing beam 9d perform a function of imaging the pattern onto wafer 3d which is coated with a resist which is sensitive to an electron exposure such that the resist may be developed in a further lithographic step. Further, the electrons of the writing beam have a function of primary electrons in a microscope of the LEEM type, i.e. they generate secondary electrons in the resist or deeper layers of wafer 3d which are used for imaging the resist onto the detector.

With the lithography system 1d it is possible to directly detect a quality of the pattern written onto the wafer 3d by analyzing the electron image received by detector 53d. A real-time control of the exposure process is possible by analyzing the images detected by the detector.

It is evident that the demand on an optical quality of both the writing beam 9d and the secondary electron beam 47d are considerably high in the system 1d since the writing beam should project an substantially accurate image of the pattern provided by the reticle onto wafer 3d, and the secondary electron beam in turn should provide a substantially accurate secondary electron image to detector 53d. A beam splitter for separating a beam path of the writing electron beam 9d from a beam path of the secondary electron beam 47d is of a configuration similar to that shown in FIG. 1 for the writing electron beam 9d and similar to that shown in FIG. 9 for the secondary electron beam 47d.

The beam splitter 23d comprises a magnetic field-free region $63d_0$ and magnetic field regions $63d_1$, $63d_2$, $63d_3$ provided in that order in the beam path of the writing beam, wherein the field region $63d_3$ and further field regions $63d_4$ and $63d_5$ are provided in that order in the beam path of the secondary electron beam 47d. The writing electron beam 9d is deflected by an angle $\phi_1$ to the right with a radius of curvature $r_1$ in magnetic field region $63d_1$, it is deflected by an angle $\phi_2$ and a radius of curvature $r_2$ to the left in magnetic field region $63d_2$, and it is deflected by an angle $\phi_3$ and a radius of curvature $r_3$ to the right in magnetic field region $63d_3$. Drift spaces of a length $d_{12}$ and $d_{23}$ are provided between field regions $63d_1$ and $63d_2$, and between $63d_2$ and $63d_3$, respectively.

The secondary electron beam is deflected by field region $63d_3$ by an angle $\phi'_3$ to the right with a radius of curvature of $r'_3$, it is deflected by an angle $\phi_4$ to the left with a radius of curvature $r_4$ in the magnetic field region $63d_4$, and it is deflected by an angle $\phi_5$ to the right with a radius of curvature $r_5$ in magnetic field region $63d_5$. Drift spaces with a length $d_{34}$ and $d_{45}$ are provided between regions $63d_3$ and $63d_4$, and $63d_4$ and $63d_5$, respectively.

Figure 11:
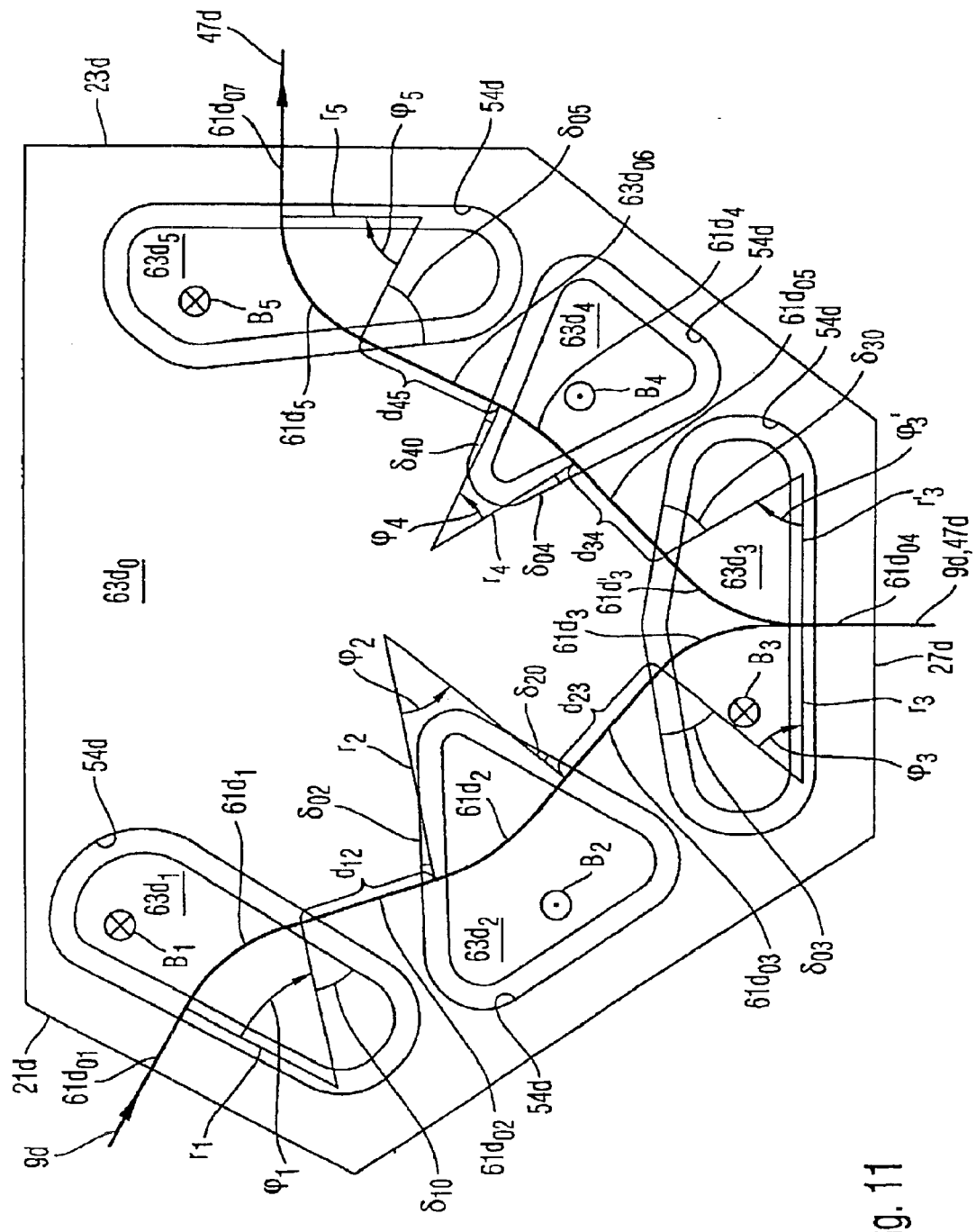
FIG. 11 schematically shows details of an arrangement of magnetic field regions of the beam splitter shown in FIG. 10.

Exemplary values of the physical properties of beam splitter 23d indicated in FIG. 11 are given in Table 4 below.

TABLE 4

| $r_1 = r_3$ | $r_2$ | $d_{12} = d_{23}$ | $\phi_1 = \phi_3$ | $-\phi_2$ | $\delta_{10} = -\delta_{03}$ | $\delta_{02} = -\delta_{20}$ |
|---|---|---|---|---|---|---|
| 17.5 mm | 17.5 mm | 15 mm | 56.5° | 53° | 49.7° | 4.5° |

| $r'_3 = r_5$ | $r_4$ | $d_{34} = d_{45}$ | $\phi'_3 = \phi_5$ | $-\phi_4$ | $\delta_{30} = -\delta_{05}$ | $\delta_{04} = -\delta_{40}$ |
|---|---|---|---|---|---|---|
| 13.7 mm | 13.7 mm | 16.7 mm | 71.5° | 52.9° | 57.5° | 2.4° |

Apart from magnetic field regions $63d_1$, $63d_2$, $63d_3$, $63d_4$ and $63d_5$ the beam splitter 23d and the lithography system 1d do not comprise further magnetic field regions providing substantial angles of deflections to the writing electron beam 9d and the secondary electron beam 47d.

In summary, the invention provides a particle-optical apparatus which provides the function of a beam splitter as well as an electron microscope provided with such a beam splitter, the beam splitter directing at least a first electron beam substantially dispersion-free and stigmatically to an object to be illuminated or away therefrom to a detector and, in so doing, separates it from a second electron beam guided in the opposite direction.

The present invention has been described by way of exemplary embodiments to which it is not limited. Variations and modifications will occur to these skilled in the art which do not depart from the scope of the present invention as recited in the claims appended hereto.

What is claimed is:

1. A particle-optical arrangement, comprising:
   a beam splitter having a main plane and three terminals; and
   a beam-guiding system for guiding a first beam and a second beam of charged particles to and away from the beam splitter, such that one of the first and second beams enters the beam splitter through a first terminal thereof, and such that another of the first and second beams leaves the beam splitter through the first terminal;
   wherein the beam splitter provides at least two field regions, wherein a magnetic field of a substantially constant strength is provided in each of the at least two field regions, wherein at least one of the at least two field regions is enclosed by a current conductor for generating the magnetic field therein;
   wherein the beam splitter provides for the first beam at least three beam-manipulating regions which are passed by the first beam, wherein each of the at least three beam-manipulating regions is a portion of one respective field region of the at least two field regions, and wherein different magnetic fields are provided in beam-manipulating regions directly adjacent to each other along a beam path of the first beam;
   wherein the beam path of the first beam intersects, when seen upon projection onto the main plane of the beam splitter, plural current conductors enclosing respective field regions at respective intersecting positions; and
   wherein the beam splitter and the beam-guiding system are configured such that curvatures of each current conductor on both sides of each respective intersecting position is of a same direction.

2. The particle-optical arrangement according to claim 1, wherein the beam splitter and the beam-guiding system are configured such that at least the first beam passes through the beam splitter substantially free of at least one of a distortion, a dispersion, and an astigmatism in at least one of a first order and a second order.

3. The particle-optical arrangement according to claim 1, wherein at least one of the at least two field regions enclosed by the current conductor is fully enclosed by the current conductor with a same direction of curvature and without any change of direction of curvature of the current conductor.

4. The particle-optical arrangement according to claim 1, wherein at least one of the beam-manipulating regions is a portion of a field-free field region of the beam splitter in which the magnetic field has a strength of substantially zero.

5. The particle-optical arrangement according to claim 1, wherein the beam-manipulating regions of the beam splitter are disposed symmetrically with respect to a plane of symmetry extending orthogonally to the main plane of the beam splitter.

6. The particle-optical arrangement according to claim 1, wherein the beam splitter provides five beam-manipulating regions which are portions of three different field regions.

7. The particle-optical arrangement according to claim 6, wherein each of the three field regions is enclosed by a current conductor, wherein the three field regions are provided by a central field region, an intermediate field region enclosing the central field region, and an outer field region enclosing the intermediate field region.

8. The particle-optical arrangement according to claim 2, wherein the beam splitter provides different deflection angles for the first and second beams when they have a substantially same kinetic energy.

9. The particle-optical arrangement according to claim 7, wherein the beam-guiding system further comprises a dispersion member disposed in a beam path of the second beam downstream of the beam splitter, wherein the dispersion member provides a dispersion for the second beam.

10. An electron-optical system comprising:
    the particle-optical arrangement according to claim 1;
    an electron source for generating the first beam;
    an objective arrangement disposed in the beam path of the first beam downstream of the first terminal of the beam splitter, for focusing the first beam in an object plane of the objective arrangement, and for guiding secondary electrons as the second beam from a region about the object plane to the first terminal of the beam splitter; and
    an electron detector located downstream of the beam splitter in the second beam.

11. The electron-optical system according to claim 10, wherein the electron-optical system is at least one of an electron microscopy system and an electron lithography system.

12. A particle-optical arrangement, comprising:
    a beam splitter having a main plane and three terminals; and
    a beam-guiding system for guiding a first beam and a second beam of charged particles to and away from the beam splitter, such that one of the first and second beams enters the beam splitter through a first terminal thereof, and such that another of the first and second beams leaves the beam splitter through the first terminal;
    wherein the beam splitter provides at least three field regions, wherein a magnetic field of a substantially constant strength is provided in each of the at least three field regions;
    wherein the beam splitter provides for the first beam exactly three beam-manipulating regions which are passed by the first beam, wherein each of the exactly three beam-manipulating regions is a portion of one respective field region of the at least three field regions, and wherein different magnetic fields are provided in beam-manipulating regions directly adjacent to each other along a beam path of the first beam; and
    wherein each of the at least three field regions is respectively completely enclosed by a different current conductor for generating the magnetic field of a field strength different from zero in each field region.

13. An electron-optical system comprising:
    the particle-optical arrangement according to claim 1;
    an electron source for generating the second beam;
    an objective arrangement disposed in the beam path of the second beam downstream of the first terminal of the beam splitter, for directing the second beam towards an object plane of the objective arrangement, and for guiding secondary electrons as the first beam from a region about the object plane to the first terminal of the beam splitter; and
    a position sensitive electron detector located downstream of the beam splitter in the first beam.

14. The electron-optical system according to claim 13, wherein the electron-optical system is at least one of an electron microscopy system and an electron lithography system.

15. The particle-optical arrangement according to claim 2, wherein the beam splitter and the beam guiding system are further configured such that the second beam passes through the beam splitter substantially free of at least one of a distortion, an energy dispersion, and an astigmatism.

16. An electron-optical system comprising:
the particle-optical arrangement according to claim 12;
an electron source for generating the first beam;
an objective arrangement disposed in the beam path of the first beam downstream of the first terminal of the beam splitter, for focusing the first beam in an object plane of the objective arrangement, and for guiding secondary electrons as the second beam from a region about the object plane to the first terminal of the beam splitter; and
an electron detector located downstream of the beam splitter in the second beam.

17. The particle-optical arrangement according to claim 12, wherein the beam splitter is configured such that at least the first beam passes through the beam splitter, in a first order substantially free of at least one of a distortion, a dispersion, and an astigmatism.

18. The particle-optical arrangement according to claim 12, wherein the exactly three beam-manipulating regions of the beam splitter passed by the first beam are disposed symmetrically with respect to a plane of symmetry extending orthogonally to the main plane of the beam splitter.

19. The particle-optical arrangement according to claim 12, wherein the beam path of the first beam upstream and downstream of the beam splitter is free of deflecting magnetic field regions providing deflection angles of more than 10°.

20. An electron-optical system comprising:
the particle-optical arrangement according to claim 12;
an electron source for generating the second beam;
an objective arrangement disposed in the beam path of the second beam downstream of the first terminal of the beam splitter, for directing the second beam towards an object plane of the objective arrangement, and for guiding secondary electrons as the first beam from a region about the object plane to the first terminal of the beam splitter; and
a position sensitive electron detector located downstream of the beam splitter in the first beam.

21. The particle-optical arrangement according to claim 12, wherein the beam splitter provides exactly three beam-manipulating regions which are passed by the second beam.

22. The particle-optical arrangement according to claim 21, wherein the beam splitter provides exactly five beam-manipulating regions.

23. A particle-optical arrangement, comprising:
a beam splitter having a main plane and three terminals; and
a beam-guiding system for guiding a first beam and a second beam of charged particles to and away from the beam splitter, such that one of the first and second beams enters the beam splitter through a first terminal thereof, and such that another of the first and second beams leaves the beam splitter through the first terminal;
wherein the beam splitter provides at least two field regions, wherein a magnetic field of a substantially constant strength is provided in each of the at least two field regions, wherein at least one of the at least two field regions is enclosed by a current conductor for generating the magnetic field therein; and
wherein the beam splitter provides for the first beam at least three beam-manipulating regions which are passed by the first beam, wherein each of the at least three beam-manipulating regions is a portion of one respective field region of the at least two field regions, and wherein different magnetic fields are provided in beam-manipulating regions directly adjacent to each other along a beam path of the first beam;
wherein exactly one of the beam-manipulating regions is a portion of a field-free field region in which the magnetic field has a strength of substantially zero;
wherein the beam splitter and the beam-guiding system are configured such that, when seen upon projection onto the main plane, the first beam, when entering the field-free field region, intersects a current conductor under a first angle and, when leaving from the field-free field region, intersects one of the same current conductor and a different current conductor at a second angle which is different from the first angle; and
wherein the beam path of the first beam upstream and downstream of the beam splitter is free of deflecting magnetic field regions providing deflection angles of more than 10°.

24. The particle-optical arrangement according to claim 23, wherein the beam splitter is configured such that at least the first beam passes through the beam splitter substantially free of at least one of a distortion, a dispersion, and an astigmatism in at least one of a first order and a second order.

25. The particle-optical arrangement according to claim 23, wherein the beam splitter provides for the first and the second beams substantially equal deflection angles.

26. An electron-optical system comprising:
the particle-optical arrangement according to claim 23;
an electron source for generating the first beam;
an objective arrangement disposed in the beam path of the first beam downstream of the first terminal of the beam splitter, for focusing the first beam in an object plane of the objective arrangement, and for guiding secondary electrons as the second beam from a region about the object plane to the first terminal of the beam splitter; and
an electron detector located downstream of the beam splitter in the second beam.

27. An electron-optical system comprising:
the particle-optical arrangement according to claim 23;
an electron source for generating the second beam;
an objective arrangement disposed in the beam path of the second beam downstream of the first terminal of the beam splitter, for directing the second beam towards an object plane of the objective arrangement, and for guiding secondary electrons as the first beam from a region about the object plane to the first terminal of the beam splitter; and
a position sensitive electron detector located downstream of the beam splitter in the first beam.

28. The particle-optical arrangement according to claim 23, wherein the beam splitter provides exactly five beam-manipulating regions which are portions of three different field regions.

29. The particle-optical arrangement according to claim 28, wherein each of the three field regions is enclosed by a current conductor, wherein the three field regions are provided by the field-free region, an intermediate field region enclosing the field-free region, and an outer field region enclosing the intermediate field region.

30. A particle-optical arrangement, comprising:
a beam splitter having a main plane and three terminals; and a beam-guiding system for guiding a first beam and a second beam of charged particles to and away from the beam splitter, such that one of the first and second beams enters the beam splitter through a first terminal thereof, and such that another of the first and second beams leaves the beam splitter through the first terminal;

wherein the beam splitter provides at least two field regions, wherein a magnetic field of a substantially constant strength is provided in each of the at least two field regions, wherein at least one of the at least two field regions is enclosed by a current conductor for generating the magnetic field therein;

wherein the beam splitter provides for the first beam at least three beam-manipulating regions which are passed by the first beam, wherein each of the at least three beam-manipulating regions is a portion of one respective field region of the at least two field regions, and wherein different magnetic fields are provided in beam-manipulating regions directly adjacent to each other along a beam path of the first beam;

wherein the beam splitter and the beam-guiding system are configured such that the beam path of the first beam through the at least three beam-manipulating regions is substantially symmetrical with respect to an axis oriented orthogonal with respect to the main plane.

31. The particle-optical arrangement according to claim 30, wherein exactly four beam-manipulating regions are provided, and wherein the beam path of the first beam upstream and downstream of the beam splitter is free of deflecting magnetic field regions providing deflection angles of more than 10°.

32. The particle-optical arrangement according to claim 30, wherein the first beam leaves the beam splitter through the first terminal along a first axis, wherein the first beam enters the beam splitter through a second terminal thereof along a second axis, and wherein the first axis substantially coincides with the second axis.

33. The particle-optical arrangement according to claim 30, wherein the magnetic fields in the at least three beam-manipulating regions subsequently extend in opposite directions.

34. The particle-optical arrangement according to claim 30, further comprising a position-sensitive detector disposed in a beam path of the second beam.

35. An electron-optical system comprising:
the particle-optical arrangement according to claim 30;
an electron source for generating the first beam;
an objective arrangement disposed in the beam path of the first beam downstream of the first terminal of the beam splitter, for focusing the first beam in an object plane of the objective arrangement, and for guiding secondary electrons as the second beam from a region about the object plane to the first terminal of the beam splitter; and
an electron detector located downstream of the beam splitter in the second beam.

36. An electron-optical system comprising:
the particle-optical arrangement according to claim 30;
an electron source for generating the second beam;
an objective arrangement disposed in the beam path of the second beam downstream of the first terminal of the beam splitter, for directing the second beam towards an object plane of the objective arrangement, and for guiding secondary electrons as the first beam from a region about the object plane to the first terminal of tile beam splitter; and
a position sensitive electron detector located downstream of the beam splitter in the first beam.

37. The particle-optical arrangement according to claim 30, wherein the magnetic fields in adjacent ones of the at least three beam-manipulating regions extend in opposite directions.

38. A particle-optical arrangement, comprising:
a beam splitter having a main plane and three terminals; and
a beam-guiding system for guiding a first beam and a second beam of charged particles to and away from the beam splitter, such that one of the first and second beams enters the beam splitter through a first terminal thereof, and such that another of the first and second beams leaves the beam splitter through the first terminal;

wherein the beam splitter provides at least three field regions, wherein a magnetic field of a substantially constant strength is provided in each of the at least three field regions, wherein at least one of the at least three field regions is enclosed by a current conductor for generating the magnetic field therein;

wherein the beam splitter provides for the first beam at least three beam-manipulating regions which are passed by the first beam, wherein each of the at least three beam-manipulating regions is a portion of one respective field region of the at least three field regions, and wherein different magnetic fields are provided in beam-manipulating regions directly adjacent to each other along a beam path of the first beam; and wherein each of the at least three field regions is respectively completely enclosed by a different current conductor, the different current conductors being arranged spaced apart from one another and without surrounding one another, for generating the magnetic field of a field strength different from zero in each field region.

39. The particle-optical arrangement according to claim 38, wherein the beam splitter is configured such that at least the first beam passes through the beam splitter, in a first order substantially free of at least one of a distortion, a dispersion, and an astigmatism.

40. The particle-optical arrangement according to claim 38, wherein the beam-manipulating regions of the beam splitter are disposed symmetrically with respect to a plane of symmetry extending orthogonally to the main plane of the beam splitter.

41. The particle-optical arrangement according to claim 38, wherein the beam path of the first beam upstream and downstream of the beam splitter is free of deflecting magnetic field regions providing deflection angles of more than 10°.

42. An electron-optical system comprising:
the particle-optical arrangement according to claim 38;
an electron source for generating the first beam;
an objective arrangement disposed in the beam path of the first beam downstream of the first terminal of the beam splitter, for focusing the first beam in an object plane of the objective arrangement, and for guiding secondary electrons as the second beam from a region about the object plane to the first terminal of the beam splitter; and
an electron detector located downstream of the beam splitter in the second beam.

43. An electron-optical system comprising:

the particle-optical arrangement according to claim 38;

an electron source for generating the second beam;

an objective arrangement disposed in the beam path of the second beam downstream of the first terminal of the beam splitter, for directing the second beam towards an object plane of the objective arrangement, and for guiding secondary electrons as the first beam from a region about the object plane to the first terminal of the beam splitter; and a position sensitive electron detector located downstream of the beam splitter in the first beam.

* * * * *

UNITED STATES PATENT AND TRADEMARK OFFICE
CERTIFICATE OF CORRECTION

PATENT NO. : 7,022,987 B2
DATED : April 4, 2006
INVENTOR(S) : Dirk Preikszas et al.

It is certified that error appears in the above-identified patent and that said Letters Patent is hereby corrected as shown below:

<u>Title page,</u>
Item [73], Assignee, "Carl Zeiss NIS GmbH (DE)" should read -- Carl Zeiss NTS GmbH (DE) --.

Signed and Sealed this

Twenty-third Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 7,022,987 B2
APPLICATION NO. : 10/634810
DATED : April 4, 2006
INVENTOR(S) : Dirk Preikszas et al.

It is certified that error appears in the above-identified patent and that said Letters Patent is hereby corrected as shown below:

Column 20, line 1, after "region about the object plane to the first terminal of", delete "tile" and insert -- the --.

Signed and Sealed this

Eighteenth Day of July, 2006

JON W. DUDAS
*Director of the United States Patent and Trademark Office*